(12) United States Patent
Harvey et al.

(10) Patent No.: US 7,026,815 B2
(45) Date of Patent: Apr. 11, 2006

(54) NOISE SUPPRESSION IN AN OPEN MR APPARATUS

(75) Inventors: Paul Royston Harvey, Eindhoven (NL); Johannes Adrianus Overweg, Uelzen (DE); Alfred Hendrik Van Ommen, Eindhoven (NL)

(73) Assignee: Koninklijke Philps Electronics N.V., Eindhoven (NL)

( * ) Notice: Subject to any disclaimer, the term of this patent is extended or adjusted under 35 U.S.C. 154(b) by 0 days.

(21) Appl. No.: 10/498,441

(22) PCT Filed: Dec. 19, 2002

(86) PCT No.: PCT/IB02/05650

§ 371 (c)(1),
(2), (4) Date: Jun. 10, 2004

(87) PCT Pub. No.: WO03/054569

PCT Pub. Date: Jul. 3, 2003

(65) Prior Publication Data

US 2005/0083056 A1    Apr. 21, 2005

(30) Foreign Application Priority Data

Dec. 20, 2001   (EP) .................................. 01205041

(51) Int. Cl.
*G01V 3/00*    (2006.01)
(52) U.S. Cl. ..................................... 324/318
(58) Field of Classification Search ........ 335/296–299, 335/216; 324/318–322
See application file for complete search history.

(56) References Cited

U.S. PATENT DOCUMENTS

| | | | |
|---|---|---|---|
| 5,698,980 A | | 12/1997 | Sellers et al. |
| 5,999,076 A | * | 12/1999 | Becker et al. ............... 335/301 |
| 6,154,110 A | * | 11/2000 | Takeshima ................... 335/299 |
| 6,208,144 B1 | * | 3/2001 | McGinley et al. ........... 324/319 |
| 6,346,816 B1 | * | 2/2002 | Damadian et al. ........... 324/319 |
| 6,433,550 B1 | * | 8/2002 | Kinanen ....................... 324/320 |
| 6,822,447 B1 | * | 11/2004 | Yamagata .................... 324/318 |
| 6,842,005 B1 | * | 1/2005 | Schuster ...................... 324/318 |

(Continued)

FOREIGN PATENT DOCUMENTS

DE    195 44 779 A1    6/1997

(Continued)

*Primary Examiner*—Diego Gutierrez
*Assistant Examiner*—Tiffany A. Fetzner
(74) *Attorney, Agent, or Firm*—Fay, Sharpe, Fagan, Minnich & McKee LLP

(57) ABSTRACT

The invention relates to an MR apparatus (1) having an examination volume (6) of the open type such that the examination volume (6) is also accessible laterally, having main coil devices (2) for producing a main magnetic field that are disposed on two opposite sides of the examination volume (6), having at least one high-frequency coil device (5) for exciting the proton precession and having at least one two-part gradient coil device (4), disposed on opposite sides of the examination volume (6), for the positional coding of the excitation of the proton precession. The dynamic Lorentz forces have hitherto resulted in a high oscillation level. It is an object of the invention to provide an MR apparatus (1) that has only a low oscillation level. The invention proposes that, on at least one side of the examination volume (6), a central recess (7) extends from the examination volume (6) and through the main coil device (2), in which recess (7) a holding element (9) is disposed to whose side facing the examination volume (6) the gradient coil device (4) is exclusively attached.

17 Claims, 7 Drawing Sheets

U.S. PATENT DOCUMENTS

Figure 1:
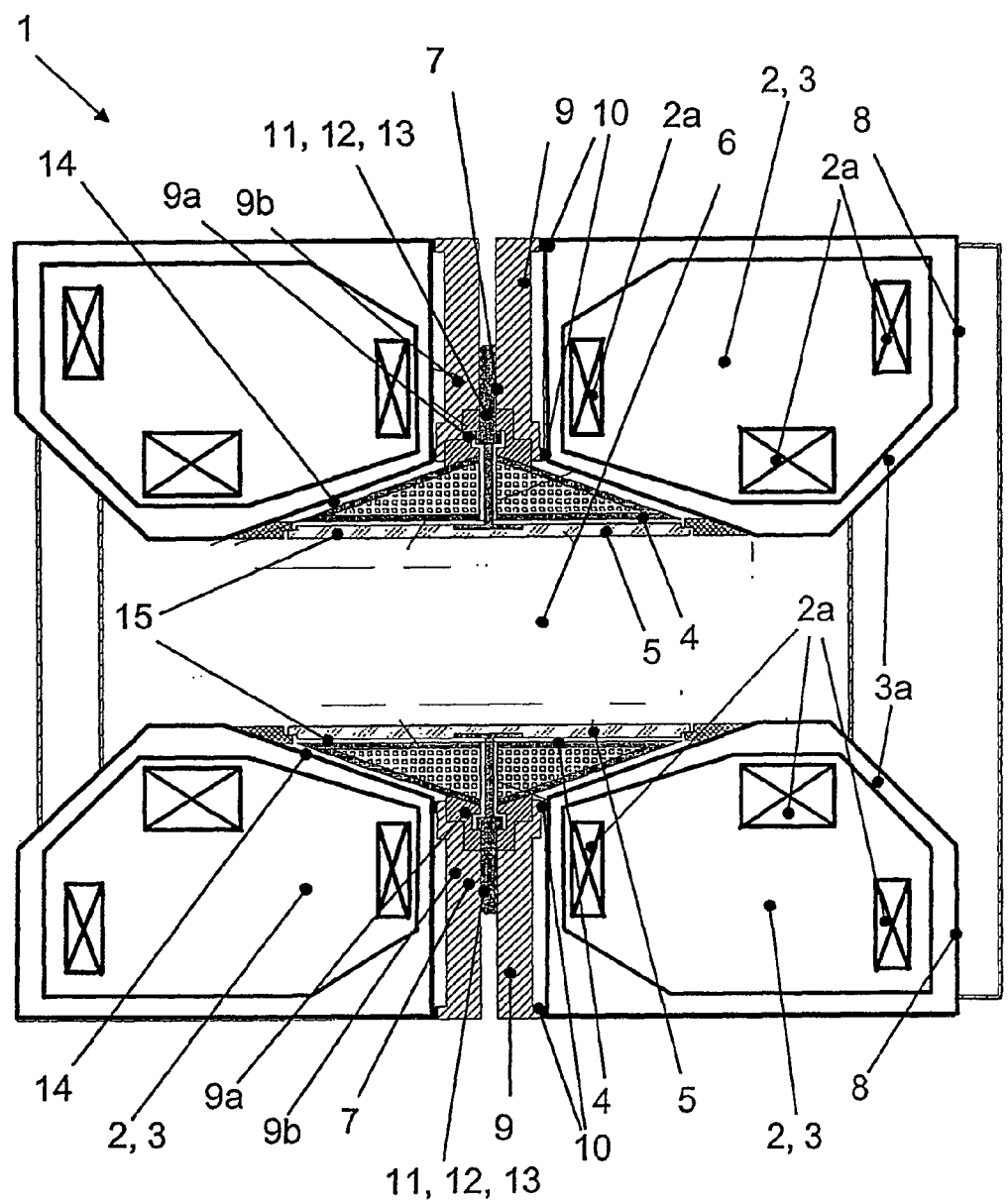

| | | | |
|---|---|---|---|
| 6,952,099 B1* | 10/2005 | Renz et al. | 324/319 |
| 2004/0113618 A1* | 6/2004 | Schuster | 324/318 |
| 2004/0113619 A1* | 6/2004 | Schuster et al. | 324/318 |
| 2004/0263171 A1* | 12/2004 | Yamagata | 324/318 |
| 2005/0040826 A1* | 2/2005 | Renz et al. | 324/318 |
| 2005/0083056 A1* | 4/2005 | Harvey et al. | 324/318 |

FOREIGN PATENT DOCUMENTS

| | | |
|---|---|---|
| WO | WO 02/46783 | 6/2002 |

* cited by examiner

NOISE SUPPRESSION IN AN OPEN MR APPARATUS

The invention relates to an MR apparatus having an examination volume of the open type such that the examination volume is also accessible laterally, having main coil devices for producing a main magnetic field that are disposed on two opposite sides of the examination volume, having at least one high-frequency coil device for exciting the proton precession and having at least one two-piece gradient coil disposed on opposite sides of the examination volume for positional coding of the excitation of the proton precession.

A main coil device is to be understood as meaning both a conventional coil device and a superconducting coil device which is cooled to a low temperature, and whose thermally insulating casing is also referred to below as a cryostat.

Within the scope of a typical magnetic resonance imaging method, the magnetic moment of the protons is aligned in one spatial direction by means of a strong stationary magnetic field of, for example, 1.5 Tesla. The individual protons are excited to precess by means of short electromagnetic, high-frequency pulses and then align themselves again according to the external, strong magnetic field. In this connection, in particular, the excitation and relaxation times and also the frequencies of the precessions are tissue-dependent and, within the scope of the measurement, provide, together with a positional coding of the excitation, information about the spatial arrangement of various tissues. The positional coding makes use of position-dependent frequencies and phases of the precession excitation and makes it possible to draw a conclusion about the position of the respective emission by means of a Fourier transformation of the measured MR signal.

The coils used for the precession excitation of the protons are, as a rule, situated in the examination space surrounded by the remaining coils.

The examination volume of known MR apparatus is generally designed as a cylindrical tube into which the patient is introduced from an axial end. The closed and constricted conditions during the examination in a conventional MR apparatus bring about an unpleasant and uncomfortable feeling in many patients and claustrophobic-type reactions in some. For this reason, the latest developments are aimed at providing an open MR apparatus. The patient lies on an examination table that contains coils or magnetic devices that interact with coil devices or magnetic devices in a roofing upper section about one half meter from the table top. The supporting area and the roofing upper section have, as integral components, the main magnets provided for aligning the protons, the gradient coils provided for the positional coding and the high-frequency coils used for the excitation.

The strong magnetic fields produce, beneath the individual coils and magnets, high forces that have to be supported. In addition to the static forces, dynamically varying forces also occur and these may cause severe oscillations and a high noise level. Since the composite tube of a closed MR apparatus is unnecessary in the open type, supporting the high static and dynamic forces is particularly problematical.

In the prior art, the gradient coils are generally mounted in a planar configuration by means of suitable attachment elements on that surface of the main coil device that points in the direction of the examination volume. The Lorentz forces that occur dynamically during operation result in a high oscillation level in this type of attachment, since the gradient coils cause the entire MR apparatus to vibrate due to their attachment to the main coil or its housing. Particularly high noise levels are produced in this connection by oscillation excitations of the cryostats that are generally used and that are surrounded by a housing forming a vacuum chamber. The main emphasis in the housing design is generally to avoid heat bridges, for which reason the housing is extremely susceptible to oscillation. The oscillations not only affect the well-being of the patient adversely, but they also impair the quality of the magnetic fields, which is accompanied by a serious loss in the image quality.

Proceeding from the disadvantages and problems of the prior art, it is an object of the invention to provide an MR apparatus of the open type with lateral accessibility and features an very low oscillation level only and low noise emissions even at high magnetic field strengths and fast switching sequences.

According to the invention, the object is achieved by an MR apparatus of the type mentioned at the outset in which a central recess extends from the examination volume through the main coil device on at least one side of the examination volume, and in the recess a holding element is disposed to whose side facing the examination volume the gradient coil device is exclusively attached.

A decisive advantage of the attachment according to the invention of the gradient coil devices resides in the extremely far-reaching mechanical decoupling of the main coil device. The main coil device can, therefore, no longer be excited to oscillate by oscillations and vibrations of the gradient coil device. The operation of the MR apparatus is, consequently, significantly quieter, which is conducive to the well-being of the patient to be examined and reduces the risk of claustrophobic states in the patient.

The low oscillation level of the MR apparatus according to the invention has, in addition, the advantage that the magnetic fields needed for imaging can be produced without interference and with a high quality, which improves the image quality of open-type MR apparatus.

An advantageous further development of the invention makes provision that the holding element is designed as a column. In this case, it is expedient to attach the gradient coil device to the axial end of the holding element that faces the examination volume. A column-type design of the holding element fits in with the internal structure of the main coil device and the arrangement of a central recess in the main coil device, since the formation of the main magnetic field in the region of the central recess does not necessarily require components of the main coil device.

Advantageously, the holding element extends in this case through out the overall depth of the main coil device and is either attached to a rigid supporting frame or to the main coil device in the central recess. If the holding element is attached in the central recess of the main coil device, it is expedient if the main coil device or the housing of the main coil device is appropriately stiffened and reinforced or the housing of the main coil device is stiffened by the joint to the holding element. If the main coil device is surrounded by a housing made, for example, of steel, the rigidity of the housing is increased by the formation of a central recess and the continuation of the housing into the central recess. The increasing rigidity brings about a lower susceptibility to oscillation excitations.

The attachment of the gradient coil device becomes particularly robust and immune to oscillations if the holding element is designed as a conical column and the wider end of the holding element is attached to an external supporting frame. The moment of resistance of the column is thus optimally adapted to the bending-moment loading that occurs.

To reduce the oscillation level and the noise development further, it is advantageous if piezoelectric or hydraulic actuators, by means of which the oscillation level can be actively controlled, are situated between the holding element and the gradient coil device.

An activation of the actuators that is dependent on the respective operating state makes it possible to compensate for a large part of the oscillations that occur. In this connection, various operating states can be matched to an optimum oscillation behavior beforehand by optimizing the frequency of the activation of the actuators beforehand by simulation or experimentally. In this case, the actuators may also be provided at the end of the holding element that points away from the gradient coil device, for example, between the holding element and a rigid supporting frame or the main coil device.

An advantageous further development of the invention makes provision that the actuators are activated as a function of the coil current in the gradient coil devices. In this connection, it is expedient to configure the respective position of the individual actuators as a function of an appropriately weighted sum of the current in the gradient coil devices for the individual spatial directions.

In particular, in the case of a housing of the main coil device made of metal or steel, it is expedient if at least a part of the stray field, but preferably the entire stray field of the gradient coil device, is actively shielded by shielding coils. In this case, the shielding coils are preferably constructed as integral components of the gradient coil devices. In this way, an excitation of the housing of the main coil device because of the Lorentz forces produced by the magnetic field can be avoided.

An advantageous further development of the invention makes provision that the gradient coils of at least one spatial direction are jointly attached to a supporting frame. In this case, it is expedient if the supporting frame has no direct mechanical coupling to the main coil device. In this way, the main coil device remains unaffected by a mechanical oscillation excitation from the gradient coil devices and the image quality and also the noise level are decisively improved.

An equally inexpensive as well as long-lived and robust design of the MR apparatus according to the invention makes provision that damping elements are disposed in the recess between the holding element and the main coil device. Cylindrical or annular three-dimensional moldings of elastomeric materials may, for example, be provided as damping elements.

In particular, if the holding element is attached in the central recess of the main coil device, it is expedient if the main coil device is of reinforced design in the region of the central recess. For example, ribbing of the housing of the main coil device or a sleeve that reinforces the recess may serve as reinforcement.

These and other aspects of the invention are apparent from and will be elucidated with reference to the embodiments described hereinafter.

Figure 2:
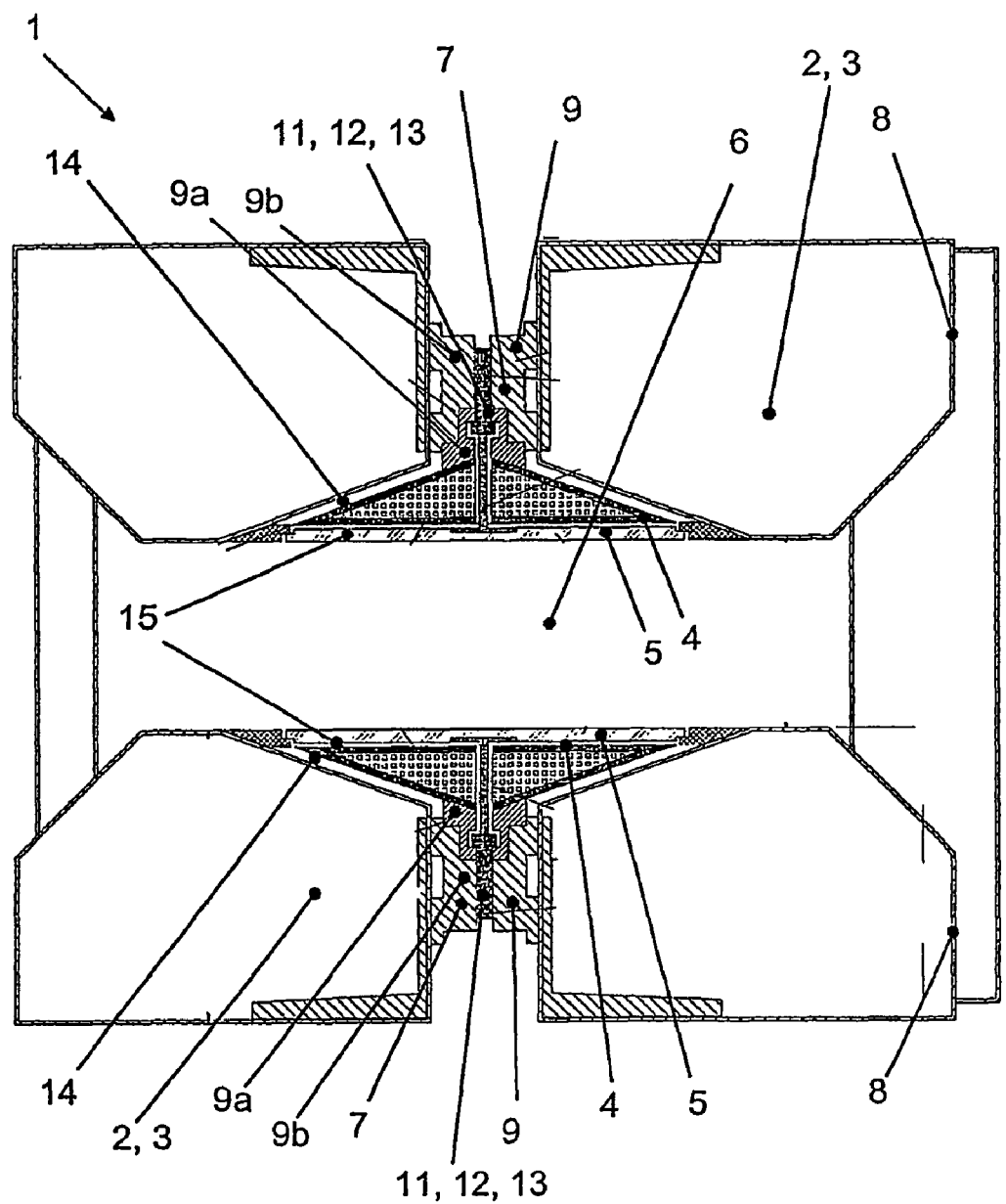
Figure 3:
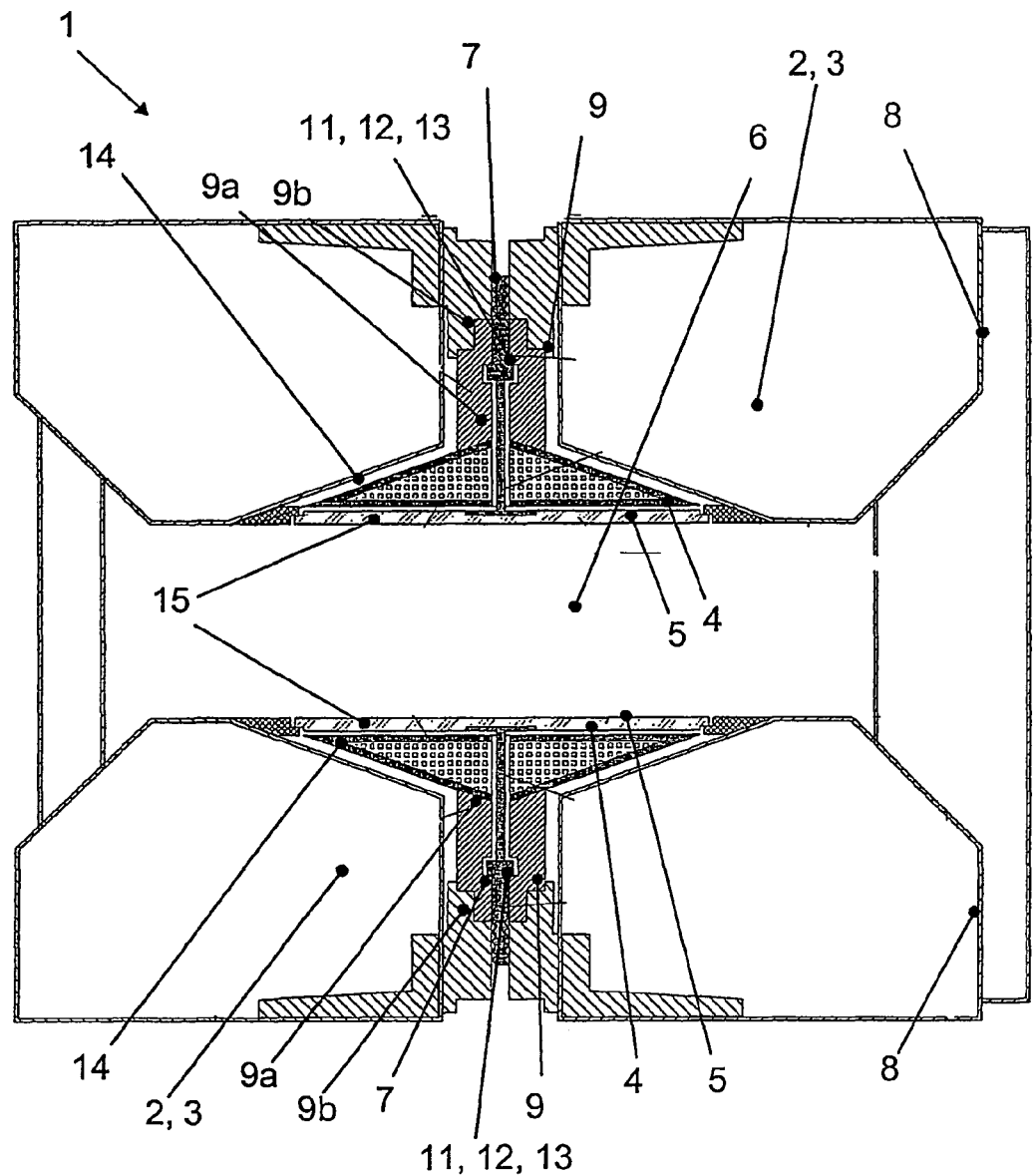
Figure 4:
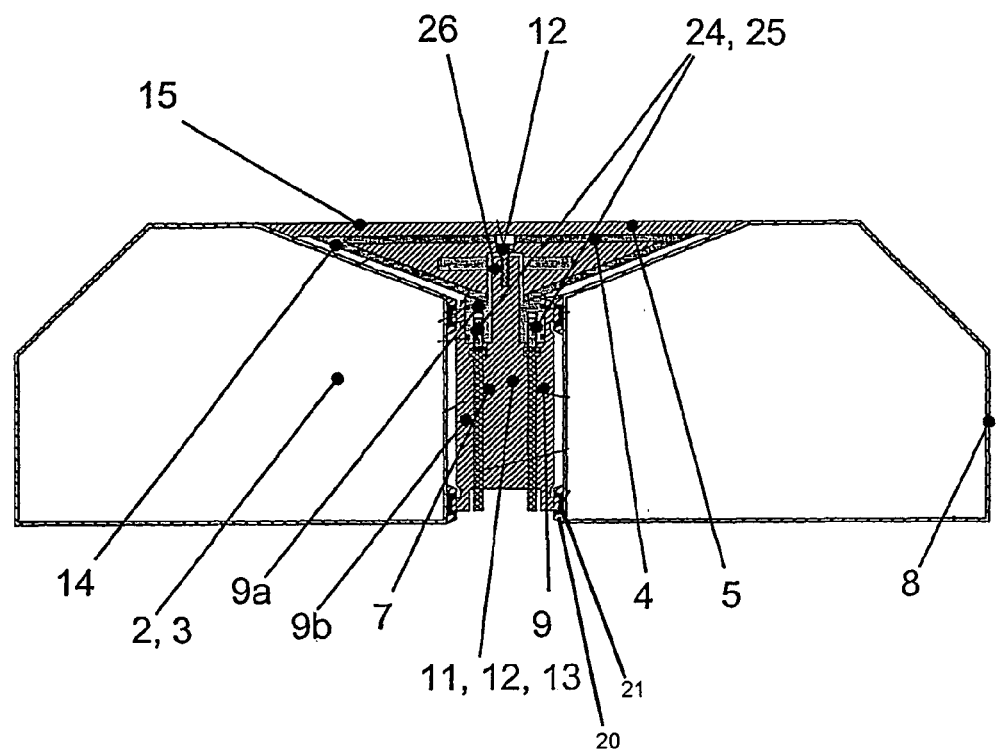
Figure 5:
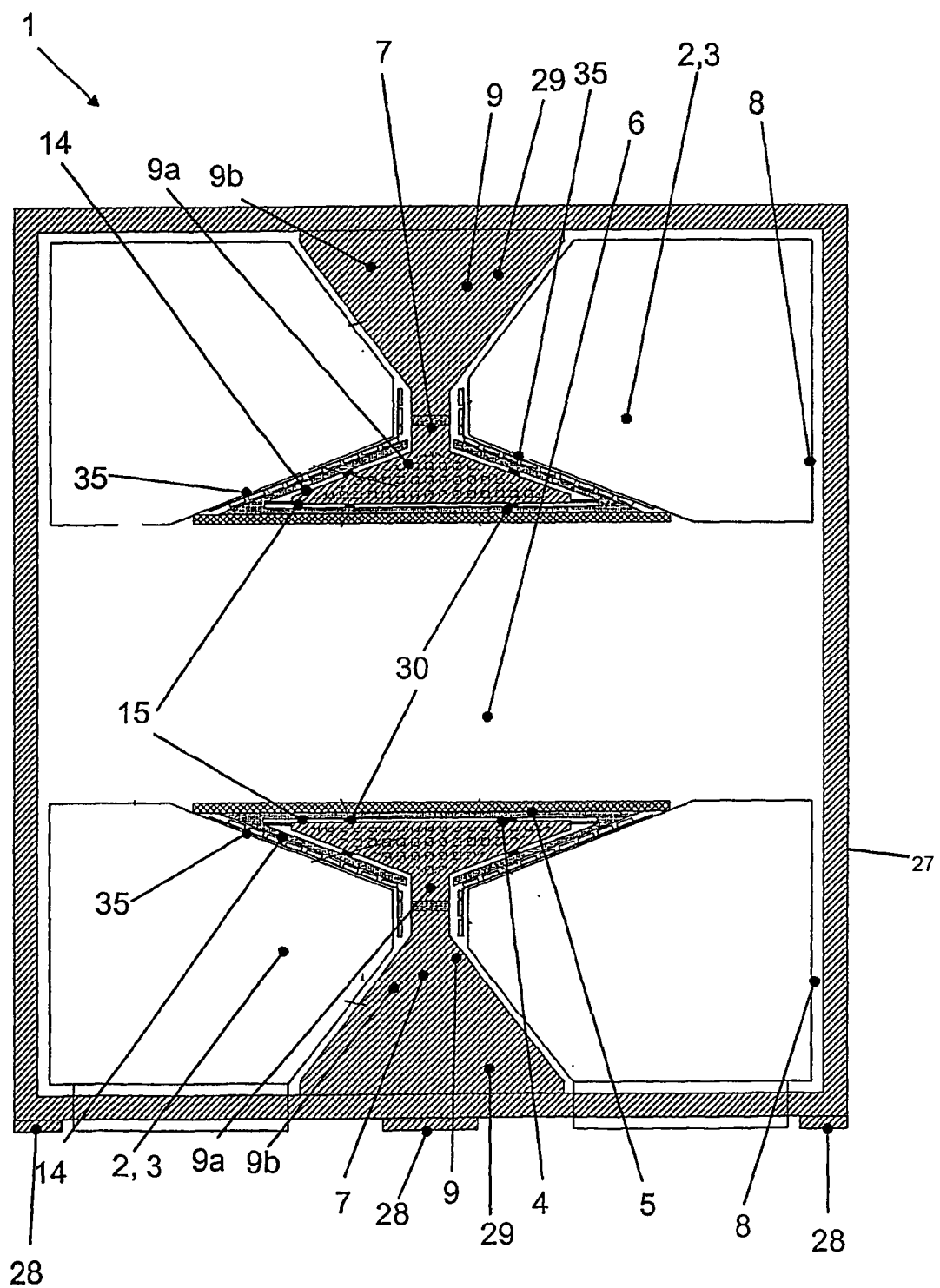
Figure 6:
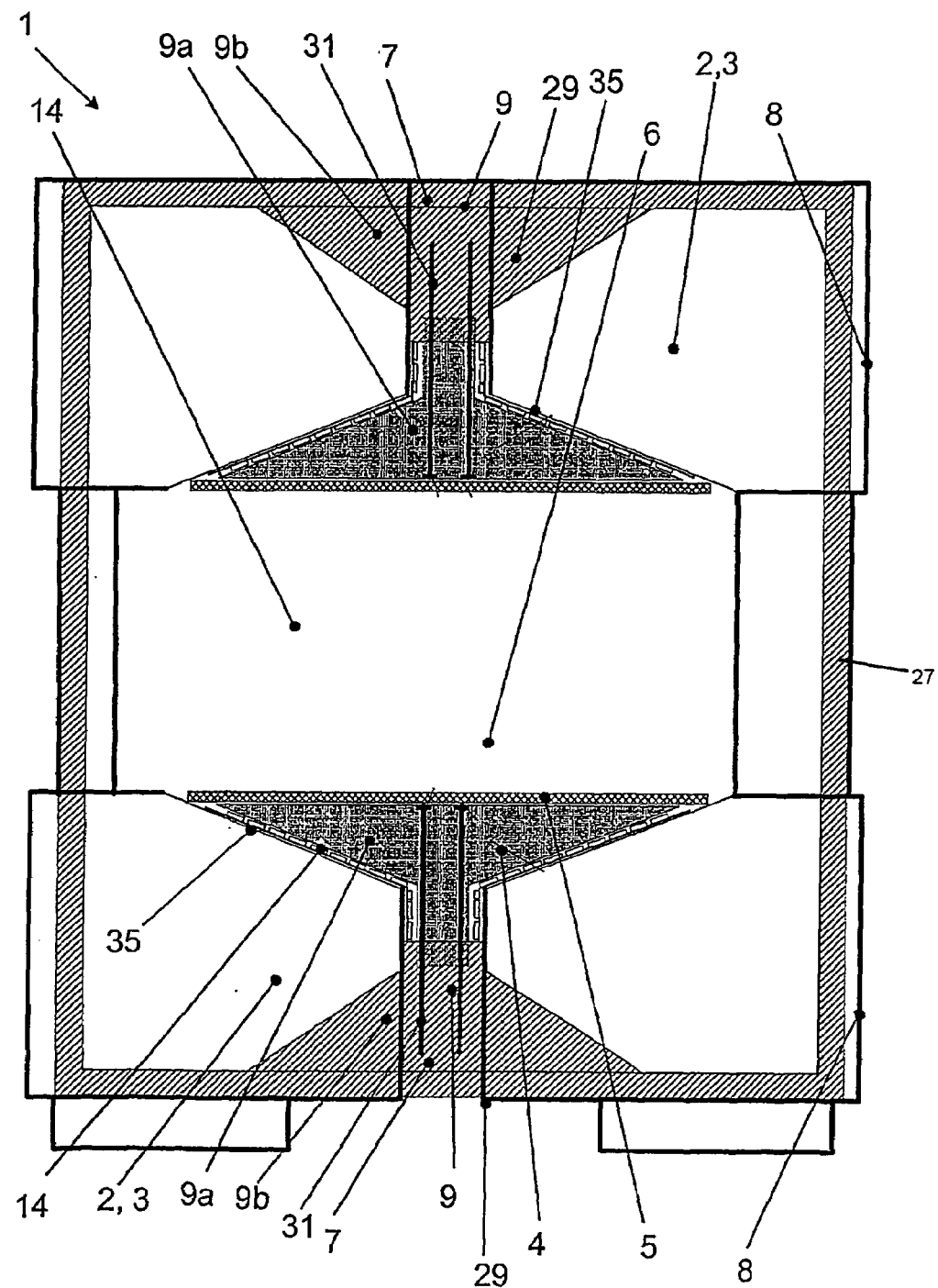
Figure 7:
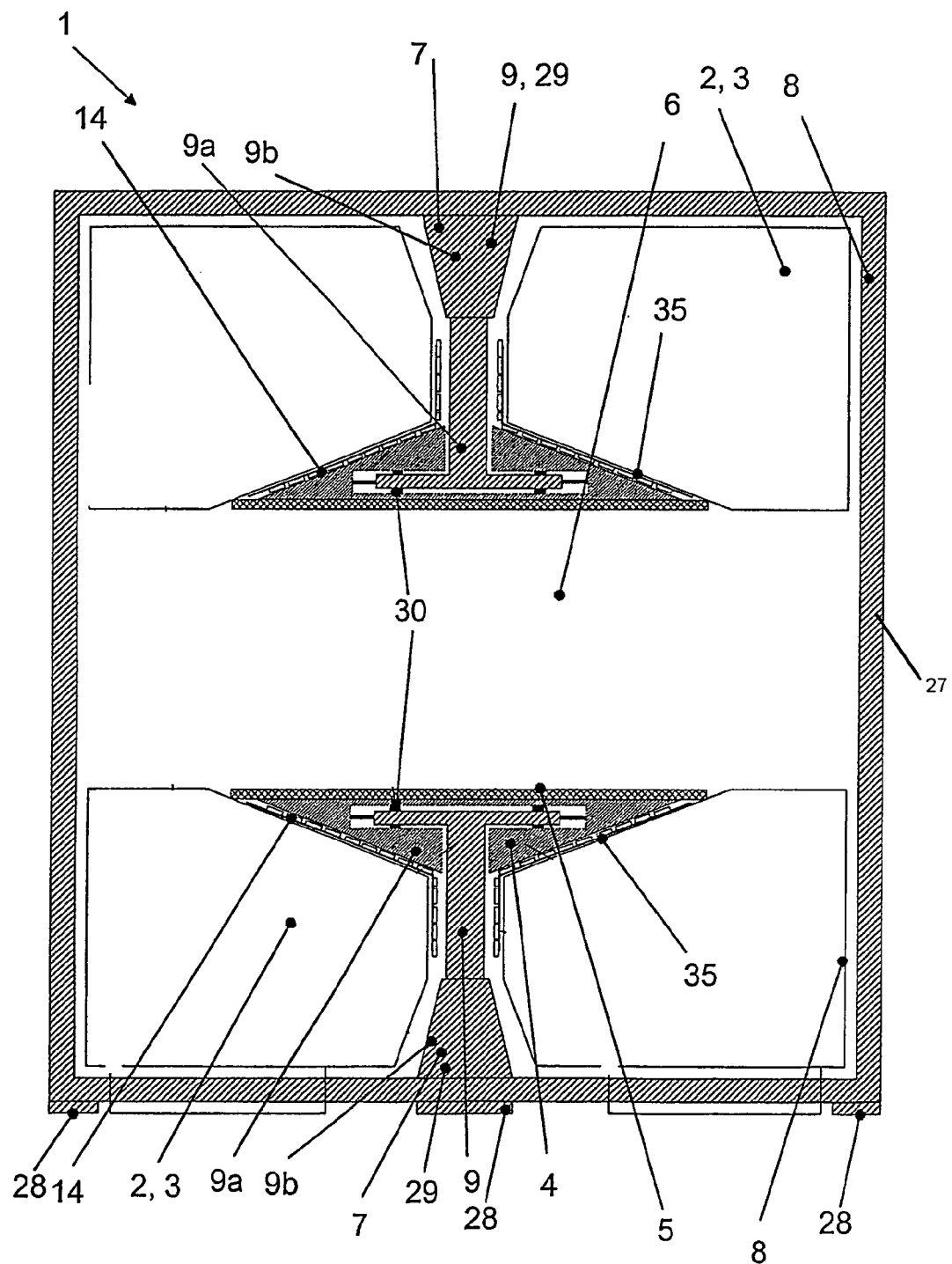

In the drawings:

FIGS. 1 to 3 show cross sections through MR apparatus having an attachment according to the invention of the gradient coil devices by means of holding elements on the housing of the main coil device, FIG. 4 shows a cross section through the lower part of an MR apparatus having a gradient coil device that is attached to a holding element according to the invention, which holding element is attached to the housing of a main coil device, FIGS. 5 to 7 show an MR apparatus having a holding element according to the invention on which a gradient coil device is attached and which is mounted on an external supporting plane.

In each of FIGS. 1 to 7, the MR apparatus 1 is denoted in its entirety by the reference symbol 1. Essential components of the MR apparatus 1 are two coupled cryostats 3, each of which accommodates a main coil device 2 that has various coils 2a that produce the magnetic field needed. The individual coils 2a are provided for producing a powerful magnetic field, constant to the greatest possible extent, for the purpose of aligning the protons and are cooled, by means of the cryostats 3, to a temperature suitable for superconduction. The cryostats 3 are each surrounded by a housing 8. Situated in the interior of the cryostats 3, adjacent in each case to the housing wall, is a vacuum chamber 3a that serves to thermally insulate the main coil devices 2 that operate at low temperature.

The gradient coil devices 4 adjoining the examination volumes 6 produce a locally variable magnetic field for the position coding of the proton excitation, and high-frequency coil devices 5 provide for the excitation of the proton precession. The two main coil devices 2 are situated underneath a laterally accessible examination volume 6. The two main coil devices 2 each have a central recess 7 that generally extends vertically through the entire main coil device 2. The main coil devices 2 are each situated in the housing 8 of the cryostat 3 that annularly surrounds the central recess 7 in each case. Situated in each of the central recesses 7 situated above and below is a respective holding element 9.

In the immediate vicinity of the examination volume 6 the high-frequency coil device 5 of flat design is situated between each time the examination volume 6 and the central recesses 7. Disposed immediately adjacent to each high-frequency coil device 5 is the gradient coil device 4, which is of flat design for the surface pointing in the direction of the examination volume 6 and conically designed for the surface pointing away from the examination volume 6. To match the conical shape of the gradient coil device 4, the housing 8 of the cryostat 3 is also of conical design at the opening of the central recess 7 into the examination volume 6.

The main coil device 2 or the housing 8 surrounding the cryostat 3 is in each case manufactured from an approximately 8 mm thick steel sheet, which ensures adequate ruggedness for absorbing the vacuum load.

The gradient coil devices 4 are each attached to a holding element 9 situated in the central recess 7.

In the exemplary embodiment shown in FIG. 1, the holding elements 9 are designed as columns and mounted on the housings 8 of the cryostats 3 by means of damping elements 10. The mounting takes place exclusively in regions of increased rigidity of the housing 8 of the cryostats 3. The damping elements 10 are constructed here as rings that are composed of an elastic material suitable for damping. The column-shaped holding elements 9 are each provided with a central bore 11 that has a longitudinal extension parallel to the central recess 7. The holding elements 9 are of a modular construction such that a screw joint 12 makes splitting into two parts 9a, 9b possible in each case. That part 9a of the holding element 9 that is situated at the side of the gradient coil device 4 is in each case firmly joined to the gradient coil device 4. A bolt 13 of the screw joint 12 extends in the direction of the examination volume 6, through the gradient coil device 4, and is in each case joined to the cryostat 3.

Provided between the gradient coil devices 4 and the housings 8 of the cryostat 3 in each case is a gap 14 of at least 2 cm in order to reliably avoid mechanical coupling or transmission of oscillations. In order to ensure that no oscillations can be transmitted in each case between the high-frequency coil device 5 and the gradient coil device 4, a gap 15 is also provided between these two components.

The holding element 9 is in each case joined to the housing 8 of the cryostat 3 only by means of two annular damping elements 10 and otherwise has sufficient clearance from the boundary walls of the central recess 7 so that no mechanical coupling of any kind can occur here either.

In the exemplary embodiment shown in FIG. 2, the holding elements 9 are each of modular structure and, when disassembled, split up into a part 9a facing the examination volume 6 and a part 9b situated further from the examination volume 9.

The exemplary embodiment in FIG. 3 proposes a similar design of the holding element 9. Here, the holding elements 9 are each likewise split into two parts 9a, 9b, the part 9b of the holding element 9, which is further away from the examination volume in each case, being designed each time as an integral component of the housing 8 of the cryostat 3. Here again, each gradient coil device 4 is attached, together with the cryostat 5, by means of a screw joint 12 to that part 9a of the holding element 9 that is nearer the examination volume 6. The housings 8 of the cryostats 3 are each reinforced by means of the parts 9b of the holding elements 9 in that region of the central recess 7 that is further away from the examination volume 6.

In the case of the exemplary embodiment shown in FIG. 4, the holding element 9 is attached to the lower housing 8 of the main coil device 2 by means of annular receptacles 20 that each have annular elastic inserts 21 for damping. The holding element 9 is each time attached to the cryostat 3 by radial bolts which are not shown.

For the purpose of energy supply and cooling of the gradient coil device 4, the holding element 9 is passed through by various leads that are routed through bores that extend in the longitudinal direction of the holding element 9. On that side of the holding element 9 that points in the direction of the examination volume 6, the leads open into electrical contacts 24 that correspond to electrical contacts 25 on the gradient coil device 4. The gradient coil device 4 is attached by means of a screw joint 12 and a radial guide 26 to the holding element 9.

In the case of the exemplary embodiments of MR apparatus 1 shown in the FIGS. 5, 6 and 7, holding elements 9 according to the invention for the two gradient coil devices 4 are attached to an external supporting frame 27. The supporting frame 27 is provided with its own mounting elements 28 so that no direct mechanical coupling of any kind occurs between the cryostat 3 and the gradient coil device 4.

In FIG. 5, the truncated cone that is remote from the external supporting frame 27 and has a steeper cone angle is partly surrounded by the gradient coil device 4. Situated in the region between the gradient coil device 4 and the cryostat are equalizing elements 35 for supporting the gradient coil 4.

In the diagram of FIG. 6 it can be clearly seen that the outer supporting frame 27 is structurally separated from the supporting structure of the cryostat 3.

The holding element 9, which is of column-shaped design in each case, is of conical design in one region and is attached by one end 29 to the external supporting frame 27. The holding element 9 has, in this case, the shape of two truncated cones that stand on one another by means of their narrow end, the truncated cone that is joined to the external supporting frame 27 being less sharply conically shaped.

In each of the MR apparatus 1 of the FIGS. 5 and 7, there are disposed between the gradient coil device 4 and the holding element 9 piezoelectric actuators 30 that serve to actively control the oscillation level. The actuators 30 are activated as a function of the operating state of the gradient coil device 4 and are designed for a minimum oscillation level.

In the embodiment shown in FIG. 6, the gradient coil device is attached to the holding element 9 by means of a plurality of screw bolts 31. The holding element 9 is of conical design almost over its entire longitudinal extension.

The holding element shown in FIG. 7 extends into the gradient coil device with a head of hammer-shaped cross section.

The invention claimed is:

1. An MR apparatus, comprising:
   an examination volume of the open type such that an examination volume is accessible laterally;
   main coil devices which produce a main magnetic field that is disposed on two opposite sides of the examination volume;
   at least one high-frequency coil device which excites the proton precession;
   at least one two-piece gradient coil device disposed on opposite sides of the examination volume configured for positionally coding the excitation of the proton precession, a central recess extending from the examination volume entirely through the main coil device on at least one side of the examination volume; and
   a holding element disposed in the central recess, with the gradient coil device being exclusively attached to a side of the holding element facing the examination volume, and the holding element being mechanically decoupled from the main coil devices.

2. An MRI apparatus as claimed in claim 1, wherein the holding element within the central recess is a column.

3. An MRI apparatus as claimed in claim 1, wherein the holding element within the central recess is a conical column and the wider end of the holding element within the central recess is attached to an external supporting frame.

4. An MRI apparatus as claimed in claim 1, further comprising:
   piezoelectric or hydraulic actuators which actively control an oscillation level disposed between the holding element within the central recess and the gradient coil.

5. An MRI apparatus as claimed in claim 1, wherein at least a part of a stray field of the gradient coil device is actively shielded by means of shielding coils.

6. An MRI apparatus as claimed in claim 1, wherein the gradient coils in at least one spatial direction are jointly attached to a supporting frame that has no direct mechanical coupling to the main coil device.

7. An MRI apparatus as claimed in claim 1, further comprising: damping elements disposed in the central recess between the holding element and the main coil device.

8. An MRI apparatus as claimed in claim 1, wherein the holding element in the central recess is also attached to the main coil device.

9. The MRI apparatus set forth in claim 1, wherein the main coil device is reinforced in the region of the central recess.

10. An magnetic resonance apparatus, comprising:
main coil devices configured for producing a main magnetic field in an examination volume arranged between the main coil devices;
a holding element disposed in a central recess extending from the examination volume completely through the main coil device on at least one side of the examination volume; and
at least one two-piece gradient coil device disposed on opposite sides of the examination volume configured for positional coding of magnetic resonance, the gradient coil device being both secured to the holding element and mechanically/vibrationally decoupled from the main coil devices, whereby the oscillations and vibrations of the gradient coil device, do not excite the main coil devices.

11. The magnetic resonance apparatus set forth in claim 10, further comprising: damping elements which vibrationally decouple the holding element within the central recess from the main coil devices.

12. The magnetic resonance apparatus set forth in claim 10, further comprising:
elastic inserts disposed between the holding element within the central recess and the main coil devices in order to provide the mechanical decoupling.

13. The magnetic resonance apparatus as set forth in claim 10, further comprising:
an external support frame supporting the holding element.

14. The magnetic resonance apparatus set forth in claim 13, wherein there is no direct mechanical coupling between the holding element within the central recess and the main coil devices.

15. The magnetic resonance apparatus set forth in claim 10, wherein the holding element within the central recess is secured to a reinforced region of a cryostat of the main coil devices, the reinforced region being distal from the examination volume.

16. A magnetic resonance apparatus, comprising:
superconducting main coils producing a main magnetic field in an examination volume arranged between the main coils;
an annular cryostat having a central recess extending all the way through the main coils on at least one side of the examination volume, with the cryostat surrounding the superconducting main coils;
a holding element disposed in a central recess of the cryostat;
a gradient coil device secured to the holding element;
damping elements or elastic inserts disposed between the holding element and the cryostat, whereby mechanical coupling, or the transmission of oscillations/vibration, is reliably avoided between the cryostat and the gradient coil device.

17. The magnetic resonance apparatus as set forth in claim 16, wherein the holding element is secured to a reinforced region of the cryostat.

* * * * *